(12) United States Patent
Griesmayer

(10) Patent No.: US 7,357,173 B2
(45) Date of Patent: Apr. 15, 2008

(54) COOLING DEVICE FOR A CHIP AND METHOD FOR ITS PRODUCTION

(75) Inventor: Erich Griesmayer, Bad Fischau-Brunn (AT)

(73) Assignee: FOTEC Forschungs- und Technologietransfer GmbH, Wr. Neustadt (AT)

( * ) Notice: Subject to any disclaimer, the term of this patent is extended or adjusted under 35 U.S.C. 154(b) by 169 days.

(21) Appl. No.: 10/865,908

(22) Filed: Jun. 14, 2004

(65) Prior Publication Data

US 2005/0039882 A1    Feb. 24, 2005

Related U.S. Application Data

(63) Continuation of application No. PCT/AT02/00352, filed on Dec. 17, 2002.

(30) Foreign Application Priority Data

Dec. 18, 2001    (AT) ............................. A 1981/2001

(51) Int. Cl.
*F28F 1/10* (2006.01)

(52) U.S. Cl. .................. 165/80.3; 257/707; 257/712; 438/122

(58) Field of Classification Search ............. 257/712, 257/706, 707, 713, 718, 720, 722; 361/704, 361/707, 709–712; 438/123, 122; 165/80.3, 165/185
See application file for complete search history.

(56) References Cited

U.S. PATENT DOCUMENTS

| | | | |
|---|---|---|---|
| 4,620,216 A * | 10/1986 | Horvath .................... 257/713 |
| 4,823,869 A | 4/1989 | Arnold et al. ............... 165/185 |
| 5,195,576 A | 3/1993 | Hatada et al. ................ 165/80 |
| 6,134,783 A * | 10/2000 | Bargman et al. ......... 29/890.03 |
| 6,269,866 B1 | 8/2001 | Yamamoto et al. ......... 165/104 |
| 6,374,490 B1 * | 4/2002 | Miyahara ................ 29/890.03 |
| 2001/0010624 A1 * | 8/2001 | Katsui ....................... 361/709 |
| 2002/0172008 A1 * | 11/2002 | Mihalis ..................... 361/697 |

FOREIGN PATENT DOCUMENTS

| | | |
|---|---|---|
| DE | 4312927 | 10/1994 |
| DE | 19712723 | 10/1998 |
| EP | 0732741 | 9/1996 |
| WO | WO00/33622 | 6/2000 |

* cited by examiner

*Primary Examiner*—Phat X. Cao
*Assistant Examiner*—Abul Kalam
(74) *Attorney, Agent, or Firm*—Jacobson Holman PLLC

(57) ABSTRACT

The invention relates to a cooling device for a chip, in particular a processor, embodied with a number of projections or fins standing essentially normal on a base surface facing away from the chip and which may be fixed to the chip by the base surface on the side thereof facing the chip. The base surface is embodied with a number of steps or ribs, which in particular form a number of through channels on arranging the base surface on the chip, whereby the channels are embodied in the base surface in a non-linear but rather in particular in a bent manner, which permits the production of a small cooling device with an appropriate cooling capacity.

17 Claims, 4 Drawing Sheets

COOLING DEVICE FOR A CHIP AND METHOD FOR ITS PRODUCTION

The present application is a continuation application of PCT/AT02/00352, filed on Dec. 17, 2002.

FIELD OF THE INVENTION

The present invention relates to a cooling device for a chip, in particular a processor, which is designed to include a plurality of projections or fins arranged substantially normal to a base surface on its side facing away from the chip and which is fixable to the chip by the base surface on its side facing the chip, wherein the base surface is designed to include a plurality of webs or ribs forming, in particular, a plurality of through channels with the base surface arranged on the chip, and a method for producing such a cooling device.

DESCRIPTION OF THE PRIOR ART

Especially when bearing in mind the increasing performances of chips and, in particular, microprocessors, the efficient cooling of such components has become necessary, to which end cooling devices including a plurality of elevations or fins and arranged on a chip to be cooled via a base surface are known, as may, for instance, be taken from U.S. Pat. No. 5,195,576, DE-A 197 12 723, EP-A 0 732 741 or DE-A 43 12 927. Known cooling devices of this type are, for instance, made of well heat-conducting metals such as, e.g., aluminum or copper, for instance, in a manner that a block configured in accordance with the overall dimensions of the cooling device to be produced is machined by the aid of cutting or milling apparatus to form said elevations or fins, which constitute an accordingly large surface for the dissipation of heat. In such known cooling devices in which the fins are milled or cut from a metallic block, the extremely high amount of material employed constitutes a drawback, because a large portion of the material used for the starting element will be removed during cutting or milling. It is, moreover, disadvantageous that complex and precise cutting or milling procedures are required for the production of accordingly small-structured cooling devices having sufficiently large heat-emission surfaces, whereby given minimum dimensions or minimum distances between the individual elevations or fins cannot be fallen short of. In addition, it is disadvantageous that basically only cutting lines or milling lines extending perpendicular or normal to one another are feasible or economically useful such that only substantially rectangular fins can be produced. Since such known cooling devices are cut or milled from a massive material or block, it is, of course, also impossible to provide any additional cooling means, for instance by introducing cooling air into the interior of the fins, whereby the surface available for the removal of heat would be accordingly increased and/or at least part of a cooling-air flow would be applied directly on the surface of the chip to be cooled.

Since the necessary cooling performances cannot be readily provided by those known cooling devices, particularly for extremely high-performing chips or processors, such cooling devices, furthermore, are manufactured with dimensions that are enlarged relative to the component to be cooled such that an extremely large space will have to be made available, the frequently required miniaturization of devices destined to receive such chips or processors, thus, being reached to an unsatisfactory degree only.

In order to further promote the cooling performance in cooling devices of the initially defined kind, it was proposed, for instance according to WO 00/33622 or U.S. Pat. No. 6,134,783, to form a plurality of substantially parallelly or linearly extending through channels in the region of the base surface such that the removal of heat in the region of the base surface towards the lateral or boundary surfaces of the base surface, and the cooling device in general, was likewise enabled via such channels or cooling channels. In those known embodiments it is particularly disadvantageous that, with cooling devices usually designed to be rectangular and adapted to the respective processor or chip shapes, the rapid removal of heat from the central region is not, or not readily, feasible on account of the large distances to be covered within the cooling channels as far as to the outlet opening on the respective lateral or boundary surface.

SUMMARY OF THE INVENTION

The present invention aims to provide a cooling device of the initially defined kind for a chip, in particular a processor, which enables further improvement of the cooling performance such that the forming heat will be properly carried off by small- or smaller-structured cooling devices, even with, in particular, increasing processor or chip performances. Further-more, it is particularly aimed at eliminating disadvantageous configurations of known fins, or elevations or projections.

To solve this object, a cooling device of the initially defined kind is essentially characterized in that the channels are formed in the base surface in a non-linear and, in particular, bent manner. By forming the channels or cooling channels provided according to the invention in the region of the base surface in a non-linear and, in particular, bent manner, it is rendered feasible to realize the removal of the forming heat to the respective cooling channel mouths opening in the peripheral region of the base surface, via paths that are shortened for the majority of the cooling channels as compared to a linear cooling channel design. By arranging webs or ribs in the region of the base channels in order to form said channels or cooling channels, which are non-linear and, in particular, bent in accordance with the invention, an accordingly increased heat removal will be achieved even in the region of the base surface, where the highest temperature prevails, so that a first, selective and reliable heat removal will be feasible via the cooling channels immediately from the component to be cooled, whereupon the heat to be carried off the processor or chip can subsequently be removed from the component to be cooled through the additionally provided projections or fins.

In order to obtain paths as short as possible in the region of the cooling channels formed in the base surface of the cooling device according to the invention, it is provided according to a preferred embodiment that the channels each open in a substantially normal manner on adjacent or neighboring lateral or boundary surfaces with the base surface being substantially rectangular. Cooling channels of this type, which are, for instance, each arranged in a quadrant and, in particular, in a rectangular manner, each opening directly on adjacent or neighboring lateral or boundary surfaces, enable the rapid removal of heat through the cooling channels with heat not removed through the cooling channels being subsequently carried off via the fins or projections.

According to a further preferred embodiment, it is provided that the channels in a central portion of the base surface each have a larger height normal to the base surface than in corner regions of the base surface. On account of such larger channel or cooling channel heights, particularly in a central portion, accordingly enlarged passage cross sections are made available to these central channels or cooling channels so as to ensure the reliable removal of heat also through these channels which require relatively larger paths, or passage paths, in the region of the base surface on account of the pregiven geometries of the cooling device according to the invention. Such an enlarged cross section, moreover, ensures that elevated amounts of heat possibly forming in a central region of a component to be cooled will be reliably removed or carried away.

According to another preferred embodiment, it is provided that the projections or fins have at least partially arcuate and, in particular, circular peripheral shapes in cross section. Due to the fact that the projections or fins in the cooling device according to the invention have at least partially arcuate peripheral or cross sectional shapes, a heat removal or heat dissipation that is enhanced relative to known cooling devices will be ensured, and it will be additionally feasible to reduce, in particular, the distances between neighboring fins as opposed to known configurations, in which the fins are produced by milling or cutting from a full block, so that the overall cooling performance will be further improved or enhanced. Besides, arcuate or circular cross sectional shapes, as opposed to regular patterns caused by the cutting or milling procedures of known cooling devices, enable the formation of relatively offset fin patterns in a manner that the cooling performance will again be selectively influenced or improved. Such arcuate or circular cross-sectional shapes may, for instance, be obtained by electrochemically or galvanically precipitating metals in suitable molds, as will be explained in more detail further below. By such a process, it is, moreover, feasible to accordingly reduce the material employed for the manufacture of a cooling device of the invention as against known cooling devices, in which interspaces between the individual projections or fins have been produced by cutting or milling with a large portion of the starting material thus having had to be discarded. By producing appropriate molds, it is, moreover, feasible to meet the respective demands placed on the cooling devices to be produced, irrespective of the limitations involved in a cutting or milling procedure. Thus, a cooling device according to the invention can be produced in a simple and reliable manner not only by reducing the material input while obtaining an enhanced cooling performance, but also by complying with the respective demands.

According to a preferred embodiment it is proposed that the fins are designed to be hollow, each comprising a passage opening on their ends facing away from the base surface. The hollow internal shapes of the fins or projections allow for the appropriate enlargement of the surface available for the dissipation of heat, and even substantially its doubling in the case of thin-walled fins, so that the removal of heat and hence the cooling performance will be accordingly increased with the external dimensions of the cooling device remaining the same. By the passage opening provided, it is furthermore ensured that the safe removal of heat from the inner surface of a fin will be achieved.

Particularly where hollow fins are provided, it is proposed according to a further preferred embodiment that the hollow interiors of the fins open into the base surface at least partially, preferably substantially completely, in the region of the passage channels so that, departing from the channels defined by the ribs or webs of the base surface, the selective discharging of thermal energy through the interior of the fins will be immediately enabled in addition to the removal through openings provided in the region of the peripheral edge of the base surface, the removal of heat being accordingly promoted or supported by the chimney effect provided by the fins. In this context, it is furthermore feasible, by providing forced ventilation as will still be explained below, to appropriately assist the removal of heat through the cross sections defined by the channels of the base surface as well as the interiors of the fins.

The enhanced removal of heat through the fins is even further promoted in that the projections or fins have heights that amount to a maximum of 12 times and, in particular, 7 times the thickness or diameter of the fins, as in correspondence with a further preferred embodiment of the device according to the invention.

In order to foster the chimney effect, it is proposed according to a further preferred embodiment that the fins have cross sectional shapes tapering to the ends facing away from the base surface.

In order to further increase the area or surface effective for the removal of heat, of the cooling device according to the invention, it is proposed according to a further preferred embodiment that the fins have coarse or roughened surfaces.

In order to provide for a defined transitional surface between the component to be cooled, whose outer casing is at least partially made of synthetic material, to which the cooling device is to be mounted or fixed, it is proposed according to a further preferred embodiment that the base surface is fixable to the chip via an intermediate plate. Such an intermediate plate may be made of an accordingly well heat-conducting material easy to fix in a reliable manner to the surface of the component to be cooled, whereby the appropriate choice of material also allows for the obtainment of a suitable heat transmission onto the cooling device via the base surface. Particularly by providing webs or ribs in the region of the base surface, thus naturally reducing the direct bearing surface on the component to be cooled, a more uniformly distributed heat removal from the component to be cooled will be promoted by the provision of such an intermediate plate.

In order to enable particularly simple fixation while simultaneously maintain good heat transmission, it is proposed according to a further preferred embodiment that the intermediate plate is connected and, in particular, soldered with the chip and/or the base surface.

In addition to rendering uniform, and facilitating, the immediate removal of heat from the component to be cooled to the cooling device, the intermediate plate may also be provided to facilitate handling as well as optionally fix accessory elements, particularly in the region of the cooling device, wherein in this respect it is proposed according to a further preferred embodiment that the intermediate plate exceeds the external dimensions of the chip and/or the base surface of the cooling device.

Such an accessory element may, for instance, be comprised of a blower or fan in order to enhance the cooling performance, wherein it is proposed in this respect that a holding means for a fan is provided on, or fixable to, the intermediate plate, as in correspondence with a further preferred embodiment of the cooling device according to the invention.

In order to obtain the necessary cooling performance, particularly with small external dimensions of the cooling device according to the invention, it is proposed according to another preferred embodiment that the cooling device and/or the intermediate plate is made of a heat-conductive material, particularly a metal and, in particular, copper, aluminum, iron, silver or gold.

In order to reduce the material input, and to obtain the desired geometries, the cooling device, as already indicated above, is producible by an electrochemical precipitation procedure, a preferred method for producing a cooling device according to the invention being essentially characterized in that a metal, particularly copper, is electromechanically or galvanically precipitated in a mold constituting a negative of the cooling device to be produced.

SHORT DESCRIPTION OF THE DRAWINGS

In the following, the invention will be explained in more detail by way of exemplary embodiments schematically illustrated in the accompanying drawing. Therein:

Figure 2:
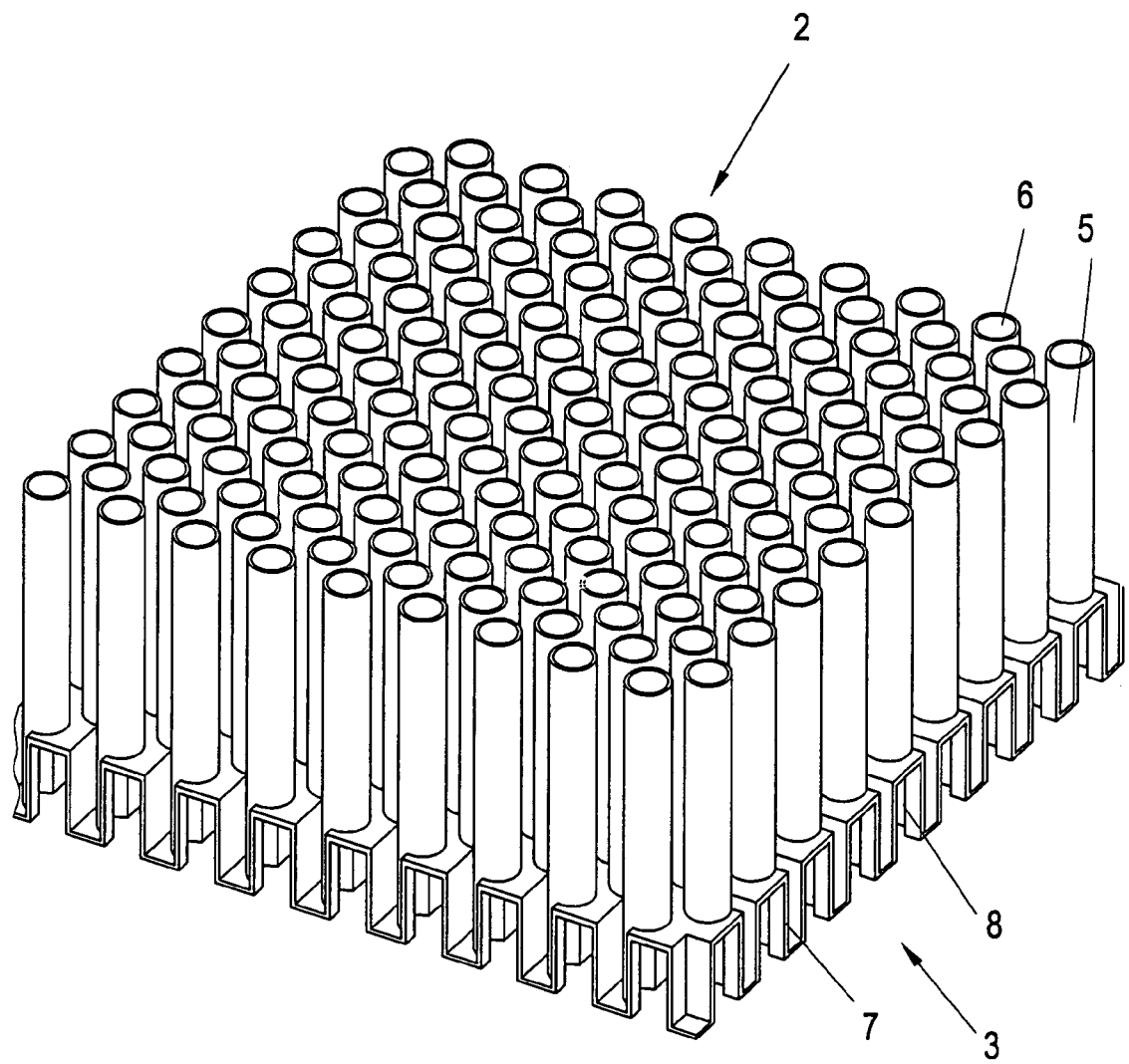
FIG. 2 is a perspective view on an enlarged scale, of a modified embodiment of a cooling device according to the invention, including projections or fins having hollow internal cross sections.
Figure 3:
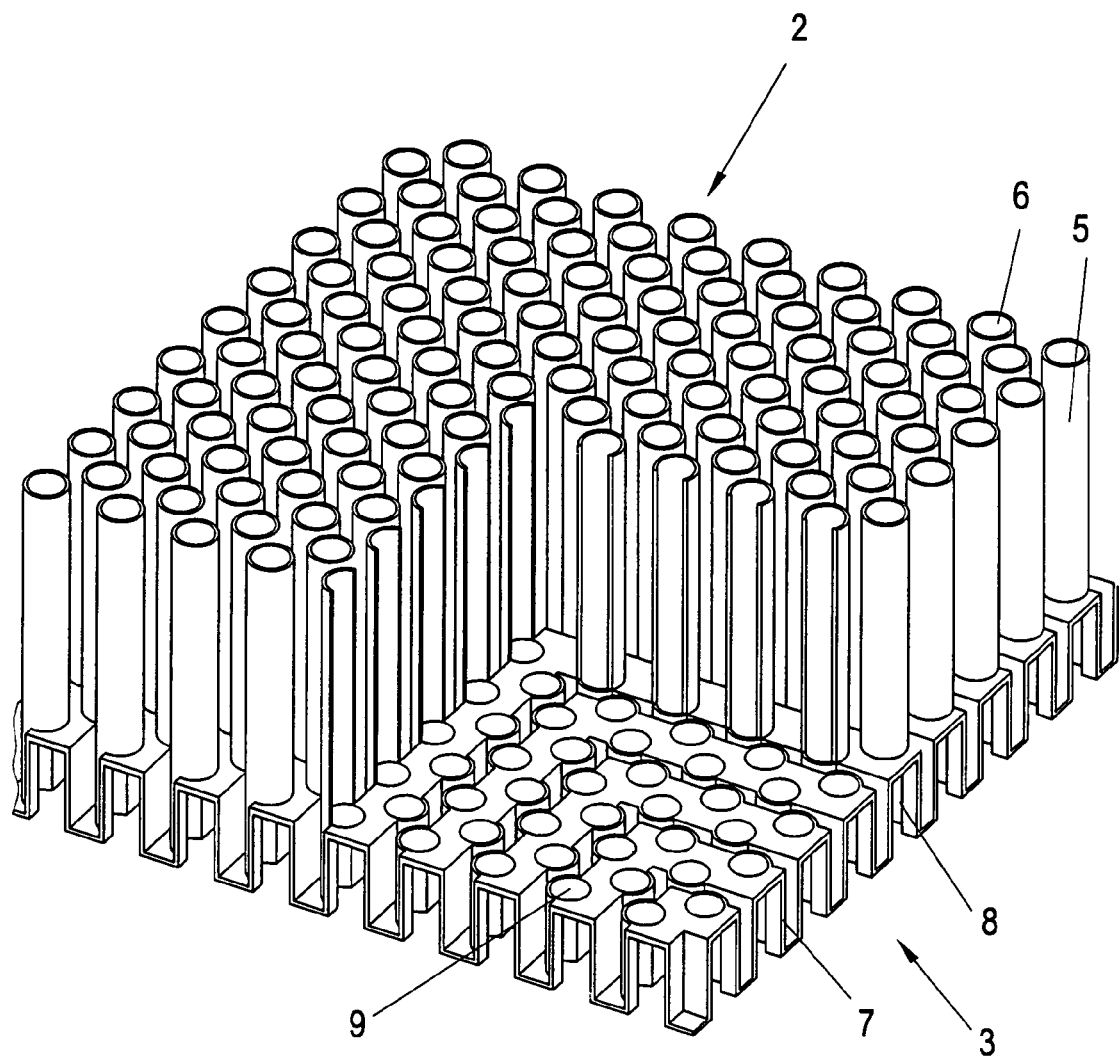
Figure 4:
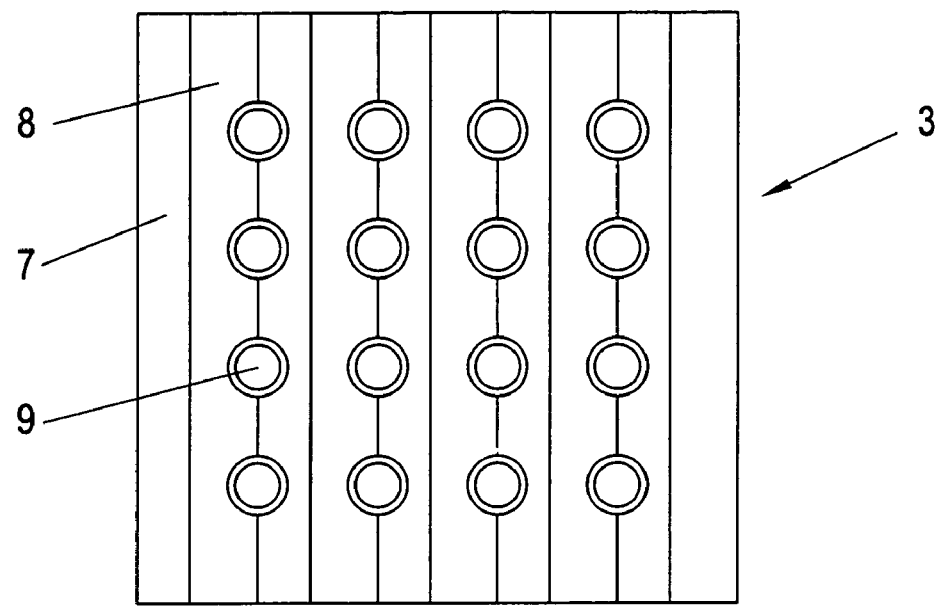
Figure 5:
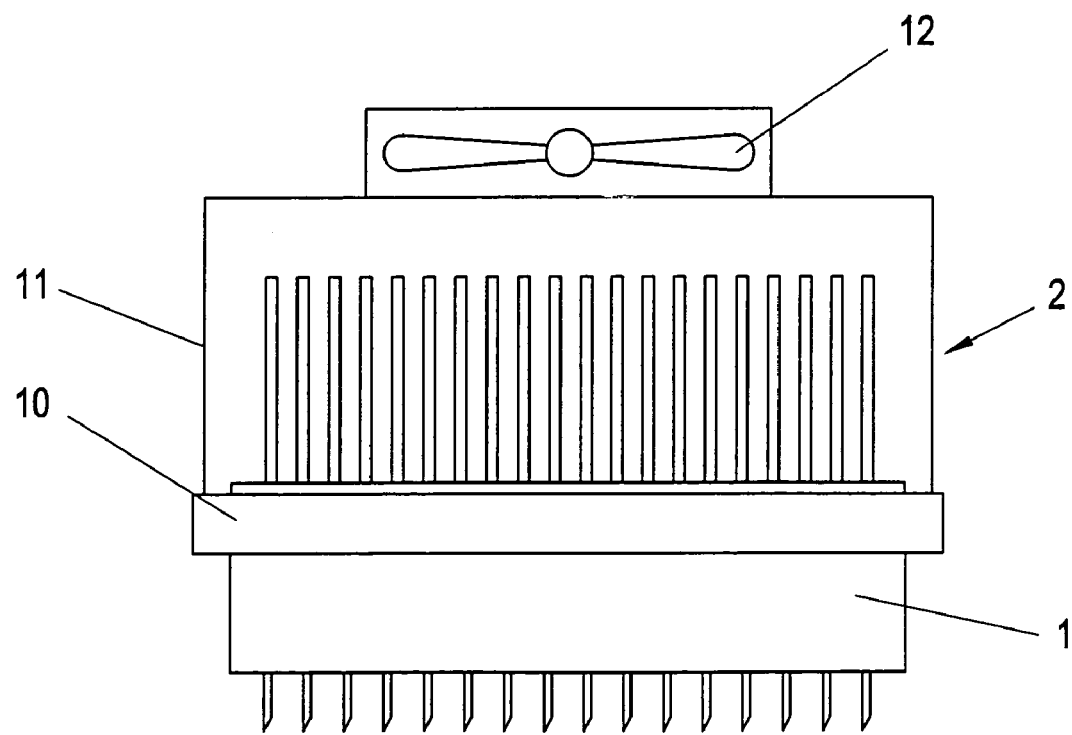

FIG. 3 in an illustration similar to that of FIG. 2 represents the configuration according to FIG. 2 with some of the fins having been cut off or cut away;

FIG. 4 is a schematic, perspective view on a base surface of a modified embodiment of a cooling device according to the invention; and FIG. 5 is a schematic side view of a further modified embodiment of a cooling device according to the invention, which is fixed via an intermediate plate to a component to be cooled.

DETAILED DESCRIPTION OF THE PREFERRED EMBODIMENTS

Figure 1:
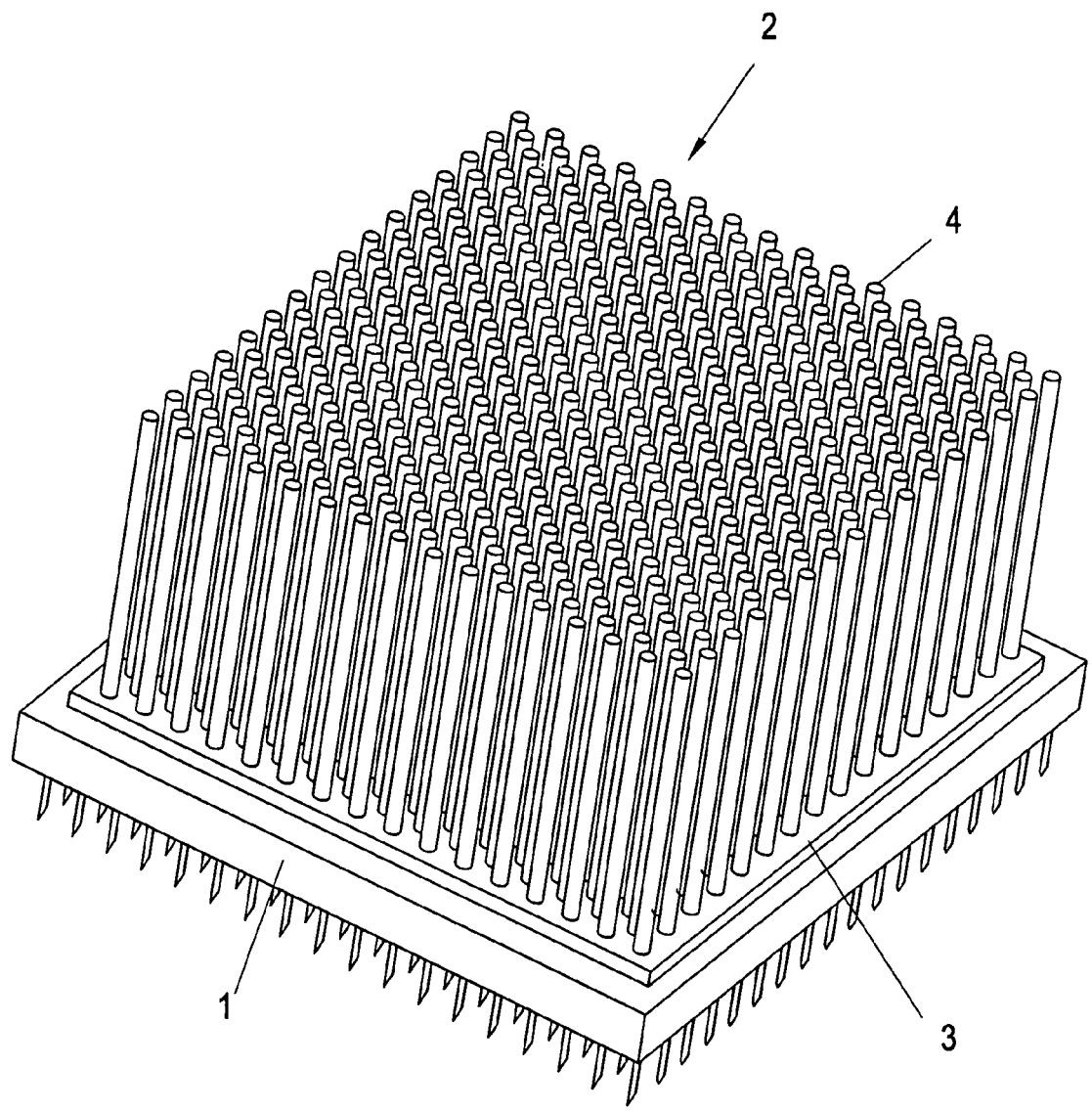
FIG. 1 is a perspective view of a first embodiment of a cooling device according to the invention, which is mounted on a chip.

In FIG. 1, a component to be cooled, in particular a chip or microprocessor, is generally indicated by 1, to which a cooling device generally denoted by 2 is to be mounted or fixed. The cooling device 2 comprises a base surface 3 with a plurality of projections or fins 4 projecting substantially normally from the base surface 3 and, in the embodiment illustrated in FIG. 1, each having a substantially circular cross section.

The cooling device 2 according to FIG. 1 is, for instance, produced by the electrochemical or galvanic precipitation of a heat-conductive material, e.g. copper, wherein, in order to obtain an accordingly large heat dissipation surface and hence an accordingly high cooling performance of the individual fins 4, the fins 4 each have a diameter of, for instance, about 2 mm at a mutual distance between neighboring fins 4 of, for instance, about 3 mm. In this manner, a plurality of fins 4 can be formed on the base surface 3 according to a desired pattern in order to provide a cooling surface that is sufficiently large to comply with the performance of the component 1 to be cooled.

Alternatively to the embodiment represented in FIG. 1, which comprises cross sections remaining substantially constant over the entire lengths of the fins or elevations or projections 4, a configuration may be provided, if desired, in which the fins are, in particular, conically tapered towards their ends facing away from the base surface 3.

In the configuration according to FIGS. 2 and 3, the cooling device, which is again denoted by 2, comprises a plurality of fins 5 which are each designed to be hollow, a hole or opening 6 being each indicated at the end facing away from the base surface 3.

It is, furthermore, apparent from the illustration according to FIGS. 2 and 3 that the base surface is provided with a plurality of ribs or webs 7, between which passage channels 8 are defined in the region of the base surface 3.

As is apparent, in particular, from the illustration according to FIG. 3, the webs or ribs 7 are arranged in a manner that the non-linear channels formed therebetween each constitute substantially rectangular channels 8 in a quadrant of the base surface 3, wherein the hollow fins 5, moreover, run into the channels 8 at least partially via openings or mouths 9 provided in the region of the base surface 3 and, in particular, in the region of the ribs or webs 7, and substantially completely on account of the respective shaping of the channels 8, so that heat to be taken up from the component not illustrated in detail will not only be carried off through the cross sections of the channels 8 opening on the side faces or peripheral edges of the base surface 3, but heat will likewise be carried off the channels 8 through the hollow interiors of the fins 5.

FIG. 4 depicts a modified embodiment of a cooling device 2, wherein a plurality of ribs or webs 7 are again provided in the region of the base surface 3, each delimiting non-linear or bent channels 8. In a manner similar to the embodiment according to FIGS. 2 and 3, the channels 8 are each designed to be substantially rectangular, opening on respectively adjacent lateral or boundary surfaces of the base surface 3.

From the embodiment according to FIG. 4, it is further apparent that the channels have larger heights in the central region or portion of the cooling device 2 than in its peripheral region, thus providing accordingly larger passage cross sections of the channels 8 in the central region of the cooling device 2.

In the embodiment according to FIG. 4, the diameters of the hollow fins or projections 5, furthermore, exhibit a height to diameter ratio that ranges approximately from 7:1 to a maximum of 10:1 as compared to the lengths of the same as well as under consideration of the smaller fin heights present in the central region on account of the larger heights of the passage channels 8.

It is, moreover, apparent from FIG. 4 that the full clear cross sections of the fins 5 are each available for the removal of heat from the channels 8 by the appropriate shaping of the cooling channels 8 in conformation to the clear cross sections of the fins 5.

In the configuration according to FIG. 5, a component to be cooled, particularly a chip or processor, is again denoted by 1, wherein a cooling device schematically indicated by 2 is fixable to, or arranged on, particularly soldered with, the component 1 to be cooled via a substantially full-surface intermediate plate 10. Such an intermediate plate 10 may be used to distribute the heat to be carried off the surface of the component 1 to be cooled and, in particular, in the event that partial regions of the component to be cooled heat up differently, or in the event that a smaller direct contact surface is present between the base surface of the cooling device 2 and the surface of the component 1 to be cooled because of ribs or webs provided in the region of the base surface.

In the schematic illustration according to FIG. 5, it is moreover indicated that a schematic holding means 11 or frame is arranged on, or fixable to, the intermediate plate 10, which has external dimensions enlarged relative to those of the component 1 to be cooled as well as the cooling device 2, on which holding means or frame a fan 12 or blower schematically denoted by 12 may, for instance, be arranged. Such an additional fan is able to increase or support the cooling performance of the cooling device 2 in a suitable manner such that, in the main, a comparatively small-structured cooling device 2 substantially matching with the dimensions of the component 1 to be cooled will do.

In order to ensure a satisfactory removal of heat at a suitable cooling performance, the cooling device 2 and/or the intermediate plate 10 are made of a heat-conductive material, in particular a metal, wherein the cooling device 2 may, for instance, be made of copper, aluminum, iron, silver or gold.

In order to minimize the amount of material required for the manufacture of the cooling device 2, it is moreover proposed that the cooling device 2 is made by electrochemical or galvanic precipitation in a mold that constitutes a negative of the cooling device 2 to be produced, so that, in particular, material losses caused by cutting or milling procedures, as happens in presently known cooling devices, will be avoided.

The invention claimed is:

1. A cooling device for a chip, said cooling device comprising
a plurality of projections or fins arranged substantially normal to and projecting from a base surface on a side of the base surface facing away from the chip and the base surface being fixable to the chip by a side of said base surface facing the chip,
the base surface including a plurality of webs or ribs forming a plurality of through channels within the base surface arranged on the chip,
every one of the channels being formed within the base surface in a non-linear and bent manner that includes a right angle, and
every one of the channels opens from a boundary surface and turns in a direction to open only in a substantially perpendicular direction, toward adjacent or neighboring lateral surfaces, which extend perpendicular to the boundary surface,
the base surface being substantially rectangular.

2. The cooling device according to claim 1, wherein the channels in a central portion of the base surface each have a larger height normal to the base surface than in corner regions of the base surface.

3. The cooling device according to claim 1, wherein the projections or fins have circular peripheral shapes in cross section.

4. The cooling device according to claim 1, wherein the projections or fins have hollow interiors, each of the projections or fins having a passage opening at an end facing away from the base surface.

5. The cooling device according to claim 4, wherein the hollow interiors of the projections or fins open into the base surface at least partially in a region of the channels.

6. The cooling device according to claim 5, wherein the hollow interiors of the projections or fins open into the base surface substantially completely in the region of the channels.

7. The cooling device according to claim 1, wherein the projections or fins have heights equal to a maximum of 12 times of a thickness or diameter of the projections or fins.

8. The cooling device according to claim 7, wherein the projections or fins have heights equal to 7 times the thickness or diameter of the projections or fins.

9. The cooling device according to claim 1, wherein the projections or fins have cross sectional shapes tapering to ends facing away from the base surface.

10. The cooling device according to claim 1, wherein the projections or fins have coarse or roughened surfaces.

11. The cooling device according to claim 1, wherein the base surface is fixable to the chip via an intermediate plate.

12. The cooling device according to claim 11, wherein the intermediate plate is soldered with at least one of the chip and the base surface.

13. The cooling device according to claim 11, wherein the intermediate plate exceeds external dimensions of at least one of the chip and the base surface.

14. The cooling device according to claim 11, wherein a holding means for a fan is provided on, or fixable to, the intermediate plate.

15. The cooling device according to claim 11, wherein the intermediate plate is made of a heat-conductive material.

16. The cooling device according to claim 15, wherein the heat-conductive material is a metal.

17. The cooling device according to claim 16, wherein the metal is one of copper, aluminum, iron, silver and gold.

* * * * *